(12) United States Patent
Chu

(10) Patent No.: US 7,510,916 B2
(45) Date of Patent: Mar. 31, 2009

(54) HIGH PERFORMANCE FET DEVICES AND METHODS THEREOF

(75) Inventor: Jack Oon Chu, Manhasset, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/971,939

(22) Filed: Jan. 10, 2008

(65) Prior Publication Data

US 2008/0108196 A1 May 8, 2008

Related U.S. Application Data

(62) Division of application No. 11/065,816, filed on Feb. 25, 2005, now Pat. No. 7,358,122, which is a division of application No. 10/427,233, filed on May 1, 2003, now Pat. No. 6,909,186.

(51) Int. Cl.
   *H01L 21/00* (2006.01)
(52) U.S. Cl. .......................... 438/149; 438/151; 257/19; 257/407; 257/E21.411
(58) Field of Classification Search ................ 438/149, 438/151, 159; 257/411, 407, 19, E21.411
   See application file for complete search history.

(56) References Cited

U.S. PATENT DOCUMENTS

| | | | |
|---|---|---|---|
| 6,218,711 B1 | 4/2001 | Yu | 257/384 |
| 6,352,872 B1 | 3/2002 | Kim | 438/24 |
| 6,395,589 B1 | 5/2002 | Yu | 438/183 |
| 6,406,951 B1 | 6/2002 | Yu | 438/183 |
| 6,492,694 B2 | 12/2002 | Noble | 257/410 |
| 6,537,369 B1 | 3/2003 | Saitoh | 117/3 |
| 6,603,156 B2 | 8/2003 | Rim | 257/190 |
| 6,624,483 B2 | 9/2003 | Kurata | 257/387 |
| 6,727,550 B2 | 4/2004 | Tezuka | 257/347 |
| 6,794,718 B2 | 9/2004 | Nowak | 257/347 |
| 6,800,910 B2 | 10/2004 | Lin | 257/410 |
| 6,815,738 B2 | 11/2004 | Rim | 257/256 |

FOREIGN PATENT DOCUMENTS

| | | |
|---|---|---|
| JP | 2001057429 | 2/2001 |
| JP | 2002026318 | 1/2002 |
| JP | 2003092399 | 3/2003 |
| JP | 2005504436 | 2/2005 |

*Primary Examiner*—Hsien-ming Lee
(74) *Attorney, Agent, or Firm*—George Sai-Halasz; Robert M. Trepp

(57) ABSTRACT

Structure and methods of fabrication are disclosed for an enhanced FET devices in which dopant impurities are prevented from diffusing through the gate insulator. The structure comprises a Si:C, or SiGe:C, layer which is sandwiched between the gate insulator and a layer which is doped with impurities in order to provide a preselected workfunction. It is further disclosed how this, and further improvements for FET devices, such as raised source/drain and multifaceted gate on insulator, MODFET on insulator are integrated with strained Si based layer on insulator technology.

4 Claims, 11 Drawing Sheets

HIGH PERFORMANCE FET DEVICES AND METHODS THEREOF

CROSS REFERENCE TO RELATED APPLICATIONS

This application is a division of application Ser. No. 11/065,816 filed Feb. 25, 2005 now U.S. Pat. No. 7,358,122, which application in turn is a divisional of application Ser. No. 10/427,233 filed May 1, 2003, now U.S. Pat. No. 6,909, 186 issued Jun. 21, 2005. Both of these applications are incorporated herein by reference in their entirety.

This application is also related to application Ser. No. 11/067,186 filed Feb. 26, 2005, incorporated herein by reference in its entirety. Application Ser. No. 11/067,186 filed Feb. 26, 2005, now U.S. Pat. No. 7,411,214 is a divisional application of application Ser. No. 10/427,233 filed May 1, 2003, now U.S. Pat. No. 6,909,186 issued: Jun. 21, 2005.

This application is further related to application, filed Jan. 9, 2008, titled "High Performance FET Devices and Methods Thereof", naming Jack Oon Chu as inventor, which application is incorporated herein by reference in its entirety, and which is also a division of application Ser. No. 11/065,816 filed Feb. 25, 2005.

FIELD OF THE INVENTION

The present invention relates to improving FET device performance as the device dimensions decrease. More specifically, the invention describes systems and methods to keep dopant impurities from diffusing through the gate insulator, to lower terminal resistance, and to use strained Si, SiGe, or Ge body on an insulator, in particular with multifaceted gate configuration MOSFETs and MODFETs.

BACKGROUND OF THE INVENTION

Today's integrated circuits include a vast number of devices. Smaller and faster devices arising from current device scaling are key to enhance performance, but it is also vital to improve or at least maintain its reliability as well. However, as MOSFET, (Metal Oxide Semiconductor Field-Effect-Transistor, a name with historic connotations meaning in general an insulated gate Field-Effect-Transistor [FET]) and in general FET, devices are being scaled down, the technology becomes more complex and changes in device structures and new fabrication methods are needed in order to maintain the expected performance enhancement from one generation of devices to the next. In this regard the semiconductor that has progressed the farthest is the primary semiconducting material of microelectronics, silicon (Si), or more broadly, Si based materials. One such Si based material of importance for microelectronics is the silicon-germanium (SiGe) alloy.

There is great difficulty in maintaining performance improvements in devices of deeply submicron generations. Several avenues are being explored for keeping device performance improvements on track. Among these is the use of either tensilely or compressively strained Si as the basic semiconducting device material having enhanced carrier mobility for electrons and holes in comparison to bulk Si transport. Further improvements can be achieved by alloying Si with Ge. Additionally, a further commonly used scheme is to build devices in a semiconducting layer which is isolated from the semiconducting substrate by a buried insulating layer. Most commonly the semiconducting layer is Si, hence the terminology SOI (Si on insulator) is generally in use, and the buried insulator is $SiO_2$, to yield the name of BOX (buried oxide). However, there are still many outstanding issues in achieving the highest possible performance in deeply submicron MOSFET devices.

As the gate insulator is thinned, as dictated by the requirements of ever smaller devices, there is the problem of the doping impurities penetrating the gate insulator, typically an $SiO_2$ layer. For the sake of optimal device design, the gate typically is made of polysilicon, which is doped the same conductivity type as the device itself. With such doping the resultant workfunction of the gate with respect to the channel region of the device allows for the threshold of the device to be optimally set. Accordingly, N-type devices are in need of N-doped gates, and P-type devices are in need of P-doped gates. During the high temperatures of device manufacturing, the gate-doping species, most problematically boron, (B), but others like phosphorus (P) as well, readily penetrate the thin gate insulator and destroys the device. The gate insulator in modern high performance devices typically needs to be less than about 3 nm thick. Preventing this dopant penetration would be an important step in achieving thinner gate insulators.

In this invention when the strained monocrystalline layer which is hosting the critical parts of the devices, such as the channel regions, is referred to as a SiGe layer it is understood that an essentially pure Si or Ge layer is included in this terminology.

For high device performance the resistance of a turned on device must be as low as possible. With smaller devices the intrinsic resistance of the device itself is decreasing, but other, so called parasitic, resistances have to be taken care of. One such resistance arises from the source terminal of the device. To minimize both the source and drain resistance, these device regions are typically implanted and then silicided during device fabrication. However, the consumption of too much Si during the silicidation process has, and does create drawbacks of its own. In SOI technologies, where the device is purposely built in a thin device layer over an insulator, this problem is especially acute. The silicide formation can easily consume the whole portion of the thin device layer in the source and drain regions. Therefore, there is a need for making the semiconductor device layer thicker especially in the source and drain regions, or find other means to reduce the effect of the source resistance.

With shortening gate lengths the so called short channel effects, most notably the "drain induced barrier lowering" (DIBL) pose severe roadblocks to miniaturization. These effects can be mitigated by introducing basic structural changes in the devices, leading to the use of multiple gates. However, this approach can only yield the desired performance improvements if it is appropriately coupled with other high performance techniques, a problem still looking for solutions.

SUMMARY OF THE INVENTION

In accordance with the objective to achieve high performance downscaled MOSFET devices, the present invention describes a system and method for solving associated problems and/or in their combinations thereof. Deposition and/or epitaxial growth of appropriate layers, both crystalline, and polycrystalline is at the core of most fabrication techniques that lead to high device performance. The preferred procedure deposition and growth is ultra high vacuum chemical vapor deposition (UHV-CVD).

It is well known that carbon (C) can serves as a retardant of dopant diffusion in both Si and SiGe materials and devices.

For example, H. J. Osten et. al., in the paper entitled "Carbon Doped SiGe Heterojunction Bipolar Transistors for High Frequency Applications, IEEE BCTM 7.1, 1999, pp 109-116, which is incorporated herein by reference, have shown that low carbon concentrations (<$10^{20}$ atom/cm3) can significantly suppress boron out-diffusion without affecting the strain or band alignment of carbon-rich SiGe:B layers in order to achieve high performance SiGe heterojunction bipolar transistors. Similarly, Rucker et. al., in a paper entitled "Dopant Diffusion in C-doped Si and SiGe: Physical Model and Experimental Verification", IEDM, 1999, pp 345-348, which is incorporated herein by reference, have further shown that carbon doping can be used to suppress P diffusion as well, in addition to suppressing the transient enhanced diffusion (TED) behavior of B. With appropriate techniques, such as UHV-CVD, during Si deposition C can be distinctly incorporated to a few percent into crystalline, or polycrystalline Si films without any residual oxygen contamination often associated with other carbon doping or growth techniques. The resulting material Si:C is practically a stopping layer for diffusing electrically active impurities, such as boron or phosphorous. The technique can also be used when C is incorporated into SiGe during deposition, giving SiGe:C films. With UHV-CVD one can deposit ultra-thin, device quality layers of Si:C or SiGe:C up to approximately 10% of C content. Disposing such a dopant barrier layer onto the gate insulator, prior to the deposition of the doped layer, has the desired effect of protecting the channel region underneath the gate insulator without upsetting the electrical properties of the device. Since from etching behavior, or a patterning point of view the properties of Si:C and SiGe:C are almost the same as those of pure Si, the Si:C or SiGe:C layer would not need any special processing, such as additional patterning, or etching step beyond those typical of standard MOSFET fabrication. The Si:C or SiGe:C can be deposited in blanket, or borderless, manner just prior to the deposition of the bulk of the gate material, which is typically doped polysilicon. It is the objective of this invention to teach the prevention of dopant impurity penetration of the gate insulator by depositing a Si:C or SiGe:C layer directly over the gate insulator to serve as the dopant diffusion barrier.

Increasing the thickness of the semiconductor over the source and regions prior to silicidation is very desirable, since state of the art devices are shallow structures with shallow source/drain junctions, and there is danger for the silicide to punch through the junctions. Selective epitaxial growth is a well developed technique especially in RT-CVD, but it is also possible to achieve in UHV-CVD fabrication of strained Si and SiGe layers. Such selectivity is of great use in depositing extra material over the desired areas. In the many steps of typical MOSFET device fabrication there is a point where the gate and the source/drain regions undergo a so called self-aligned silicidation process. This means that although there may be many different open surfaces on the wafers there is no need for masking, the silicidation process itself is executed in a manner that it selects the desired regions where it deposits, mostly over exposed semiconductor surfaces. Moreover, the selective CVD process can also be tuned to deposit only over the source, the source and the drain, or additionally over the gate and other desired areas, such as contacts and polysilicon interconnects. With such a selective deposition, just prior to the deposition of the siliciding metal, such as Ni, Co, Ir, Ti, W, and Pt the semiconductor material is thickened in precisely the desired regions of the source and/or the drain. The following silicidation step will now be able to avail itself to more semiconductor material for complete consumption and final formation of the metal silicide. It is the objective of this invention to combine the technique of raising the source/drain junctions by selective deposition, with the technique of disposing Si:C, or SiGe:C, over the gate insulator, and with the technique of using high performance strained SiGe over insulator device materials.

Along the path of seeking ever higher device performances, downscaling of MOSFET devices is the established guiding principle for current CMOS device technology. However, there are visible limits to straightforward downsizing as short-channel effects (SCE) becomes a major problem and concern when devices are scaled down to the nanometer regime. A proposed way out of this problem is the use of multifaceted gate devices. Such a device is not simply a planar structure conducting on one surface, but conducting on more than one side, or facet on the surface of a device body. The reasons that a multifaceted gate device can be downscaled further than a regular planar device are relatively complex, but they have been already given in the technical literature, for instance in: "Device Design Considerations for Double-Gate, Ground-Plane, and Single-Gated Ultra-Thin SOI MOSFET's at the 25 nm Channel Length Generation," by H.-S. P. Wong, et al, 1998 IEDM Tech Dig., pp. 407-10. It is a further object of the present invention to teach high performance ultra short devices obtainable with the combination of strained Si or SiGe on insulator technology, multifaceted gate techniques, and with the ultra smooth channel interfaces allowed by epitaxial gate oxide deposition.

MODFET (Modulation Doped FET) devices offer another avenue toward high performance. MODFET devices as such are known in the art. However, the same techniques, such as wafer transfer, used in creating multifaceted gate MOSFETs can be used to create novel MODFET devices on insulator. These novel MODFETs are hosted in a strained Si based layer directly on the insulator, without any intervening conducting, or semiconducting buffer layer. The term of hosting a device in a certain material, or layer, means that the critical part of the device, that which is mainly sensitive to carrier properties, such as, for instance, the channel of MOS, or MODFET devices, is residing in, composed of, housed in, that certain material, or layer.

There is a large number of patents and publication relating to the subject of high performance MOSFET devices. They cover some aspects of improving MOSFET performance, but none teaches the full extent of the present invention. The references that follow, give background materials for the present invention.

U.S. Pat. No. 6,524,935 entitled: "Preparation of Strained Si/SiGe on Insulator by Hydrogen Induced Layer Transfer Technique" to D. Canaperi et al., incorporated herein by reference, teaches strain layer deposition and Hydrogen induced layer transfer (SmartCut), but it does not teach the present invention.

Formation of SiGe layers can proceed as described in U.S. Pat. No. 5,659,187 to LeGoues et al. titled: "Low Defect Density/arbitrary Lattice Constant Heteroepitaxial Layers" incorporated herein by reference.

Fabrication of a tensilely strained SiGe layer, and use of C in conjunction with Si and SiGe is taught in U.S. patent application titled: "Strained Si based layer made by UHV-CVD, and Devices Therein", by J. O. Chu et al, filed Feb. 11, 2002, Ser. No. 10/073,562, (Now U.S. Pat. No. 6,649,492) incorporated herein by reference, but this application does not teach the present invention.

Fabrication of both tensilely and compressively strained SiGe layers on the same insulator, and how to achieve ultra thin strained layers on insulator is taught in U.S. patent application titled: "Dual Strain-State SiGe Layers for Microelectronics", by J. Chu, filed Mar. 15, 2003, Ser. No. 10/389,145 (Now U.S. Pat. No. 6,963,078), incorporated herein by reference, but this application does not teach the present invention.

Formation of raised source/drain is described in U.S. Pat. No. 6,063,676 to Choi et al, titled: "Mosfet with raised source and drain regions" but this patent does not teach the present invention.

Fabrication of a double gate MOSFET on SOI is taught in U.S. Pat. No. 6,352,872 to Kim et al, titled: "SOI device with double gate and method for fabricating the same", but this patent does not teach the present invention.

In preferred embodiments of the invention, the fabrication steps leading to the described device improvements are done by UHV-CVD processes, and preferably in an AICVD system as described in U.S. Pat. No. 6,013,134 to J. Chu et al, titled: "Advance Integrated Chemical Vapor Deposition (AICVD) for Semiconductor Devices", incorporated herein by reference.

MODFET devices have been previously built in SiGe layers where the composition of the layers was tailored for device properties. Such is the invention of U.S. Pat. No. 5,534,713 to K. Ismail and F. Stern, titled "Complementary metal-oxide semiconductor transistor logic using strained SI/SIGE heterostructure layers" incorporated herein by reference, where the details of the MODFET structure and fabrication thereof can be found. However, this patent does not teach the present invention, where the layer hosting the device is directly on the insulator.

The invention further teaches the devices hosted in the strained Si based layers on insulators, which can operate from 400° K to 5° K, and teaches processors functioning with such devices. The high end of the approximate range, 400° K, although achievable with the high performance techniques disclosed herein, it is not the most preferable for the optimal FET performance. High performance is associated with strained device layers, and SOI technology, and also with low temperature operation. Device performance (for FET type devices) improves with decrease in temperature. To obtain the optimal performance of devices at low temperatures they have to be device-designed already for low temperature operation. Such device-designs, optimized for low temperature operation, are well known in the previous art. A desirable temperature range for low temperature high performance FET operation is between about 250° K and 70° K. This invention, by combining the device-designs for operation in the 400° K to 5° K range with the SOI technology and with the both tensilely and compressively strained device layers directly on the insulators aims at devices and processors of the utmost performance. Devices where the strained layers are directly on the insulators are especially suitable for low temperature operation due to their low capacitance. Also, multifaceted gate devices have relatively large surfaces which helps decreasing source/drain resistance, another advantage for low temperature operation. An all cases where Shottky junction electrodes are utilized, as in several of the high performance devices disclosed herein, benefit from low temperature operation.

BRIEF DESCRIPTION OF THE DRAWINGS

These and other features of the present invention will become apparent from the accompanying detailed description and drawings, wherein.

DETAILED DESCRIPTION OF THE INVENTION

As the gate insulator, usually $SiO_2$, thickness is being scaled down, i.e. below 5-10 nm, there is strong tendency that during any annealing, or rapid thermal annealing (RTA) steps, which are part of the device manufacturing process, the dopant originally in the polysilicon layer on the gate insulator diffuses through the gate insulator into the channel region of the MOSFET body. These dopants in the channel region would dramatically degrade the performance of the device. The doping level in the gate for 100 nm devices has to be at a very high level, i.e. $>10^{21}/cm^3$. The common P-type dopant Boron (B) is the most prone to penetrate the gate insulator.

It was experimentally found that when a gate stack was made with two layers, a thin Si:C over the $SiO_2$, followed by a heavily B doped polysilicon layer, then after annealing the gate using RTA at 1000° C. for 60 seconds, much of the boron from the $P^{++}$ polysilicon layer was "arrested" within the poly-Si:C barrier layer, and very little dopant diffused through the oxide. On the other hand, when the poly-Si:C layer was not present, the boron dopants from the $P^{++}$ polysilicon layer have penetrated through the gate oxide as expected. The ability to grow device quality poly-Si:C or poly-SiGe:C films is the result of a newly developed UHV-CVD carbon process using ethylene as the preferred carbon precursor where no residual oxygen contaminations are present, or incorporated, during the carbon growth process. The growth of device quality poly-Si:C or poly-SiGe:C by UHV-CVD is further described in U.S. patent application titled: "Epitaxial and Polycrystalline Growth of $Si_{1-x-y}Ge_xC_y$ and $S_{1-y}C_y$ Alloy Layers on Si by UHV-CVD, by J. O. Chu filed Apr. 20, 2001 (Now U.S. Pat. No. 6,750,119), incorporated herein by reference. Now it is possible to grow the P$^{++}$ poly-silicon and the poly-Si:C layers over an oxide layer in a borderless fashion. Moreover, adding this thin poly-Si:C or poly-SiGe:C barrier layer will not have a significant effect on the resistivity or the electrical properties of the gate electrode. In the embodiment when employing a poly-SiGe:C barrier layer the overall resistivity of the gate electrode can improve due to the presence of germanium in the gate stack.

Figure 1:
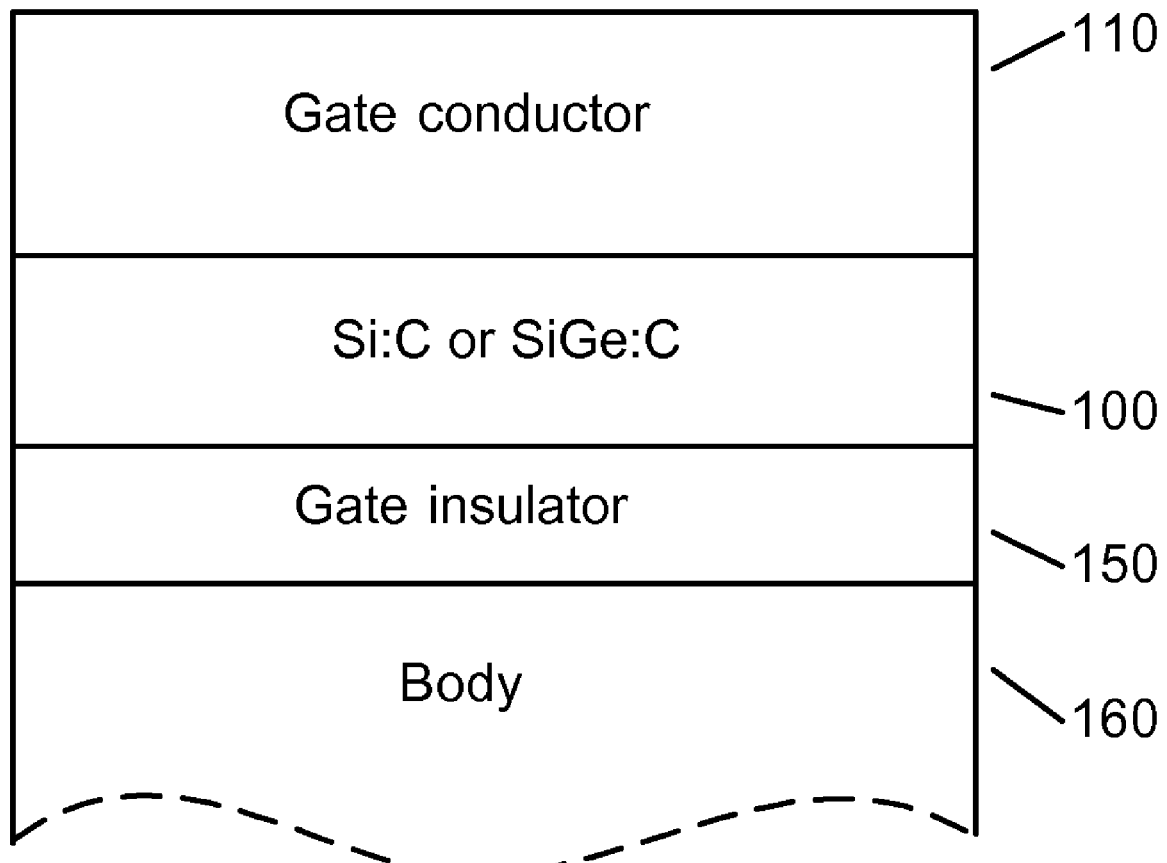
FIG. 1 Shows a cross sectional view of a layered structure to be used in a MOSFET device for preventing dopant penetration across the gate insulator.

FIG. 1 shows a cross sectional view of a layered structure, to be used in a MOSFET device for preventing dopant penetration across the gate insulator. Layer 160 serves for hosting the body of the MOSFET device. This body 160 can be part of a Si substrate, or part of a device layer on top of an insulator, as in SOI technology. For highest performance devices the body layer 160 would be a strained Si, SiGe including almost pure Ge, having enhanced carrier mobility, layer over an insulator structure. Over the channel region of the body is a gate insulator 150. This insulator usually is $SiO_2$, but it could be $Al_2O_3$, $HfO_2$, or $Ta_2O_5$, or any other gate insulator. On top of the insulator 150 one deposits, usually by UHV-CVD, an ultra-thin, device quality, poly Si:C or poly SiGe:C 100 with a C content in the range from 0.5% to 10%. Disposing such a first layer, of Si:C or SiGe:C 100, with a thickness about 1 nm to 5 nm, onto a gate insulator 150 prior to the deposition of the second layer (the doped layer 110), has the desired effect of protecting the channel region underneath the gate insulator without upsetting the electrical properties of the device. Since the material properties of Si:C and SiGe:C from an etching or a patterning point of view are practically identical to those of pure Si, the Si:C or SiGe:C layer would not need any additional patterning, or etching step beyond those typical of standard MOSFET fabrication. The initial Si:C or SiGe:C is preferred to be deposited in a blanket, or borderless, manner just prior to the deposition of the bulk of the gate material 110, which is typically polysilicon. The gate insulator penetration by a dopant is the most problematic for the case when the dopant is B, however barrier the effect of the Si:C and SiGe:C is not limited to B alone. Layer 150 offers protection against the diffusion of other P-type dopants and against N-type dopants, such as P, as well.

Figure 2A:
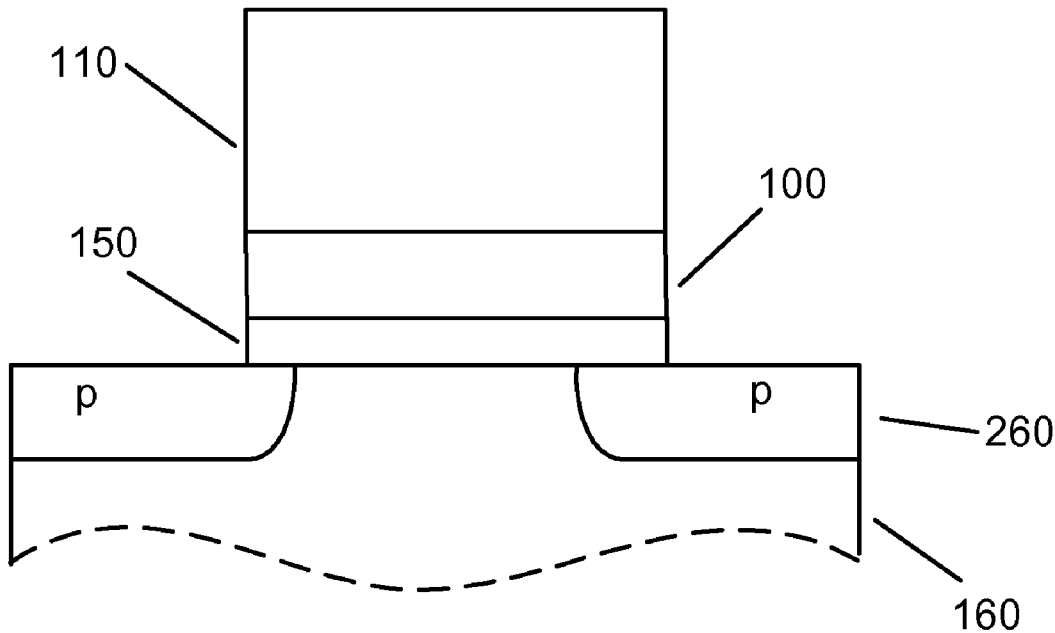
FIG. 2 Shows a schematic cross sectional view of a MOSFET device incorporating the layered structure for preventing dopant penetration across the gate insulator.
Figure 2B:
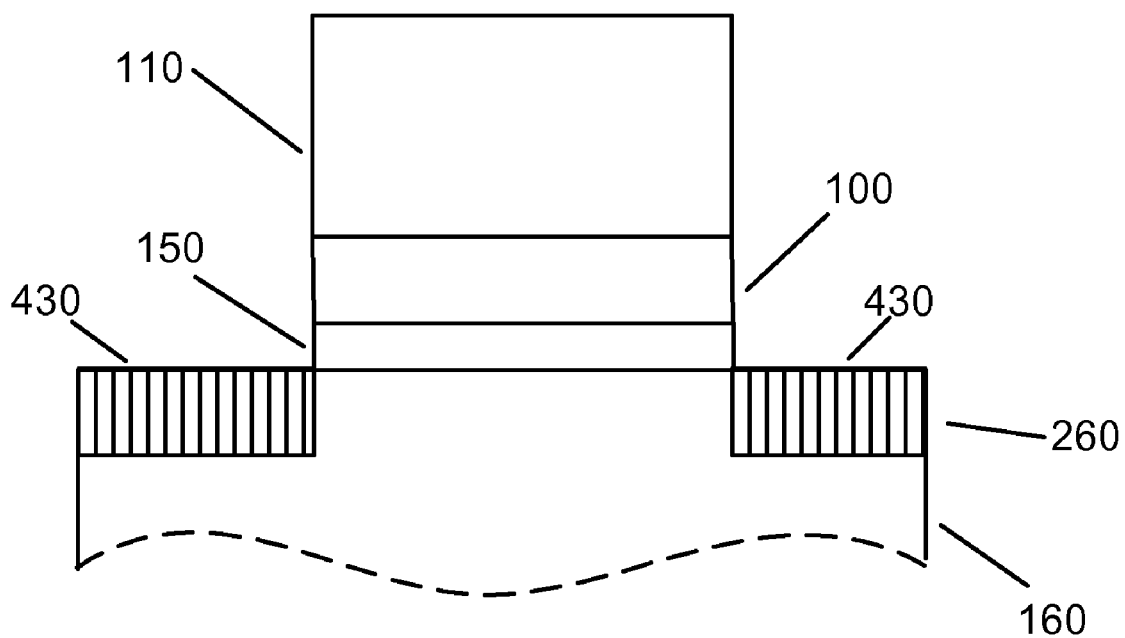

FIG. 2 shows a schematic cross sectional view of a MOSFET device incorporating the layered structure for preventing dopant penetration across the gate insulator. Here again, the device region of the MOSFET is shown by body layer 160, but now it further includes the fabricated source/drain regions 260 underneath the gate stack in FIG. 2A, and Shottky-barrier contact source/drain 260 in FIG. 2B. FIG. 2A as shown further describes the case when the device is a P-MOS with P-type source and drain, but this should not be read as a limitation. It is important however, that the type of device, namely whether it is a P or an N type, determines what kind of impurities have to be in the second layer, the doped gate layer 110. The gate has to be doped with the proper impurities to provide a selected, or desired, workfunction with respect to the channel region of the device. This workfunction determines to a large extent the threshold voltage of the device. Layer 150 is the gate insulator, and 100 is the first layer, the Si:C or SiGe:C diffusion preventing layer. In FIG. 2 these layers are shown as already having formed into a gate stack over the body layer 160.

In some embodiments, typically when the gate is shorter than about 50 nm, there maybe an advantage in using a Schottky-barrier contact for the source-to-channel interface. The term "Schottky-barrier contact" is standard nomenclature for a contact between a semiconductor and a metal. Accordingly, as shown for a representative embodiment in FIG. 2B, the source, or source/drain 260 silicidation process can be allowed to proceed until the silicide 430 meets the channel region under, or at the edge of the gate stack, and indeed for it to consume all of the source junction. In the process, the drain junction might, or might not, turn into a Schottky-barrier contact, but either way is acceptable, since the drain junction resistance has much less importance for device performance than the source junction resistance.

Figure 3:
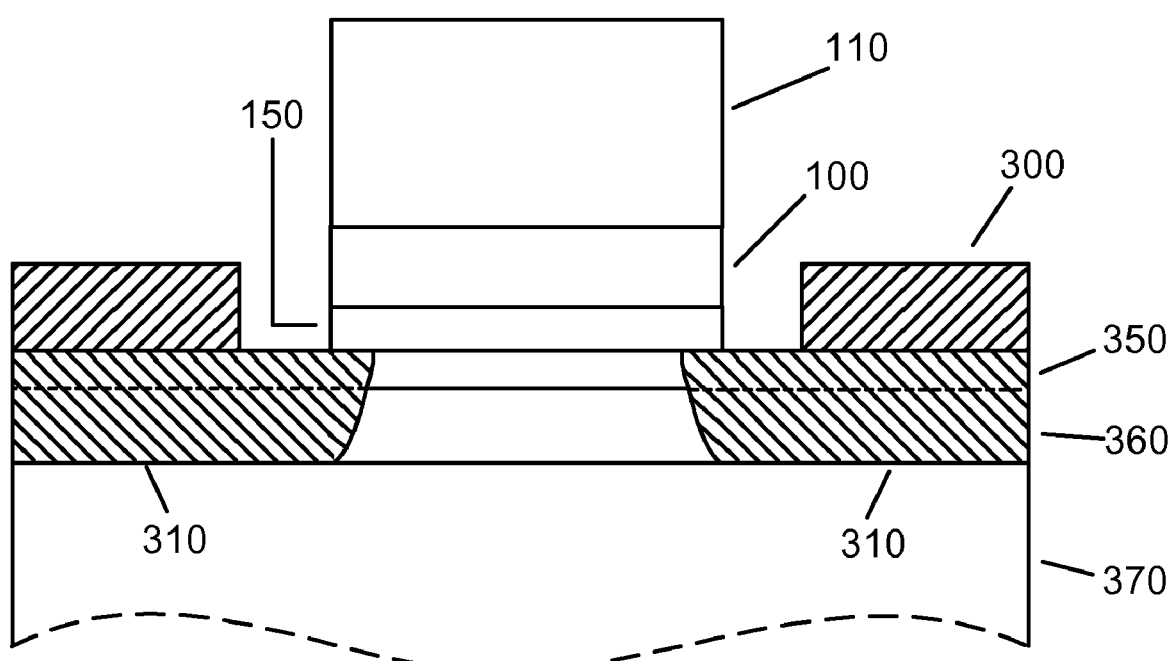
FIG. 3 Shows a schematic cross sectional view of a MOSFET device incorporating raised source/drain regions and the layered structure for preventing dopant penetration across the gate insulator.

FIG. 3 shows a schematic cross sectional view of a high performance MOSFET device incorporating raised source/drain regions and the layered structure for preventing dopant penetration across the gate insulator. An insulator layer 370, typically a BOX, supports and electrically isolates the other layers of the device. Layers 350 and 360 on top of the BOX layer 370 form the thin device layer. Layer 350 on the top is the one which hosts the channel region under the gate insulator 150. Layer 350 is a strained, either tensilely or compressively, SiGe layer, typically between about 2 nm and 50 nm thick. Layer 360 is a supporting layer, typically a SiGe relaxed buffer. The part of the gate stack shown is same as in FIG. 2: the diffusion preventing layer 100, and the doped layer 110, typically polysilicon. The source and drain regions of the device layer 310, have been raised by depositing layer 300. This is accomplished by selective deposition of Si, Si:C, SiGe, or SiGe:C onto exposed semiconductor regions. FIG. 3 is only schematic, it does not show features that are not central to the embodiment, such as possible side-walls or spacer layers on the gate, and many other details. With the additional semiconducting material 300 over the junctions 310, one decreases the chances that upon forming a silicided contact, the silicide consumes too much of the junction regions, which would usually be detrimental for device behavior.

Figure 4:
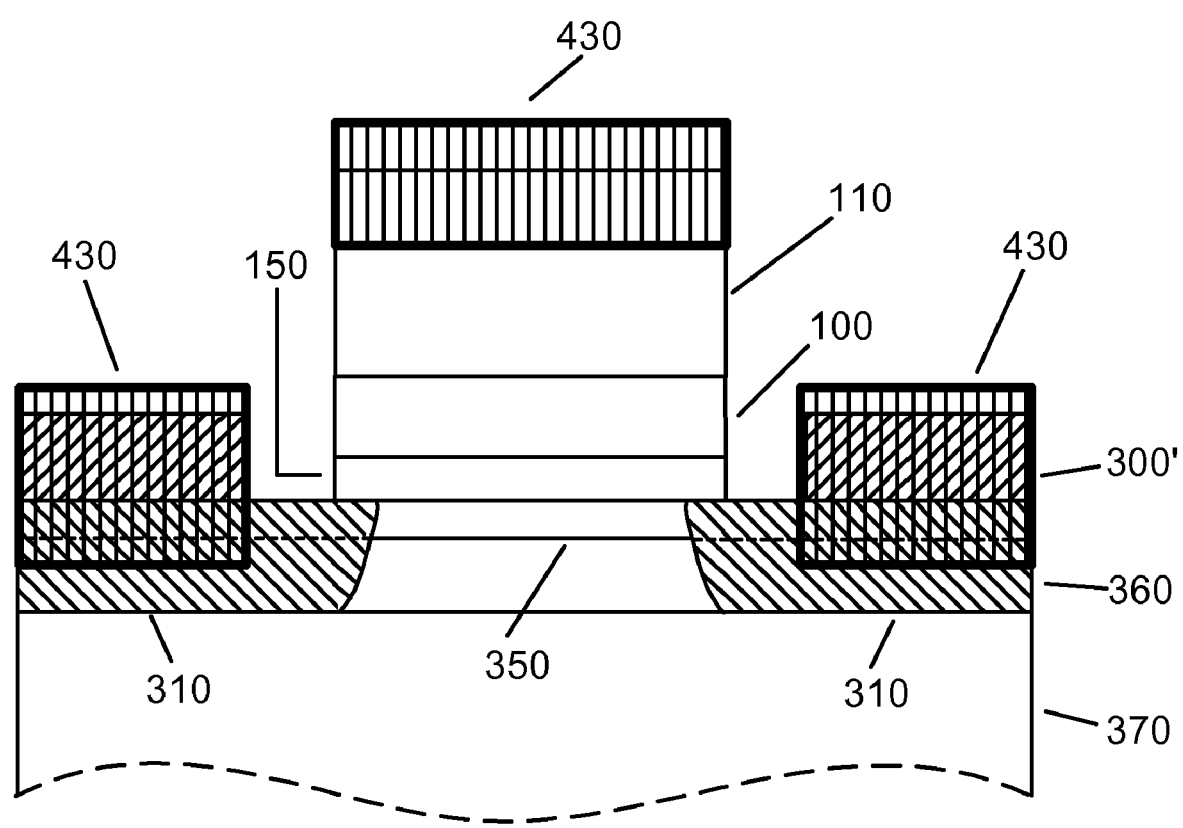
FIG. 4 Shows a schematic cross sectional view of a MOSFET as in FIG. 3 after a silicidation step has been completed.

FIG. 4 shows a schematic cross sectional view of a high performance MOSFET as the one in FIG. 3, after a silicidation step has been completed. The silicided regions 430 form contacts over the source and drain, and forms a metallic layer over the gate for improved gate conductivity. Because of the additional semiconducting material available in the raised regions 300', the source/drain silicide process allows the source/drain contacts to be completely silicided and consequently to be fully electrically functional. The notation 300' indicates that this is the region which was occupied by the raised part of the source/drain, however, after the silicidation there is essentially only a uniform block of silicide 430. The metals which are typically used for forming silicide with silicon are Ni, Co, Pt, Ti, W, Ir, or any of their combinations thereof.

The effect of source terminal resistance is generally more important in device behavior that the effect of drain terminal resistance. One skilled in the art would notice, that the described selective epitaxy for raising a terminal can be employed for each terminal independently of the other terminal. In other words, the source and the drain can be raised individually, both at the same time, or both in sequence.

FIG. 5 shows schematically, embodiments of a strained Si based monocrystalline MOSFET on insulator, with a multi-faceted gate, having a current flow in parallel with the surface plane of the supporting platform. FIG. 5A and FIG. 5B show two views of a strained SiGe MOSFET on insulator where the gate 500 comprises two electrodes on the bottom facet and a top facet of the channel region of the Si based strained strip. The strained Si based monocrystalline strip typically is Si, SiGe, Si:C, SiGe:C, or approaching almost pure Ge. Direction of device currents in this device, shown as a thick arrow 501, is in parallel direction with the surface plane 596 of the supporting platform 595, 590, and bottom electrode 500, wherein the supporting platform has a surface plane 596, that plane which is interfacing with the Si based strained strip, or layer segment. This indicates that the device is in a so called "horizontal configuration". FIG. 5A shows the side view of the device, and FIG. 5B is a cross sectional view along the broken centerline "a" of FIG. 5A. In this embodiment a strained Si based monocrystalline strip 510 has channel regions on two of its facets, or sides. One is on the bottom facet 511 which is the one bonding to said supporting platform, and another channel region is on at least one of the top facets 512, with the side facets not taking part in device action. The whole device rests on a substrate 590, typically Si, with an insulator layer on top 595. The device is double gated, the gate 500 has two electrodes on two facets of the multifaceted strained body 510, overlaying the channel regions and 511 and 512 interfacing with the gate insulator. In this device layers 595, 590, and the gate electrode 500, engaging the insulator 595 together are forming the supporting platform.

Figure 5A:
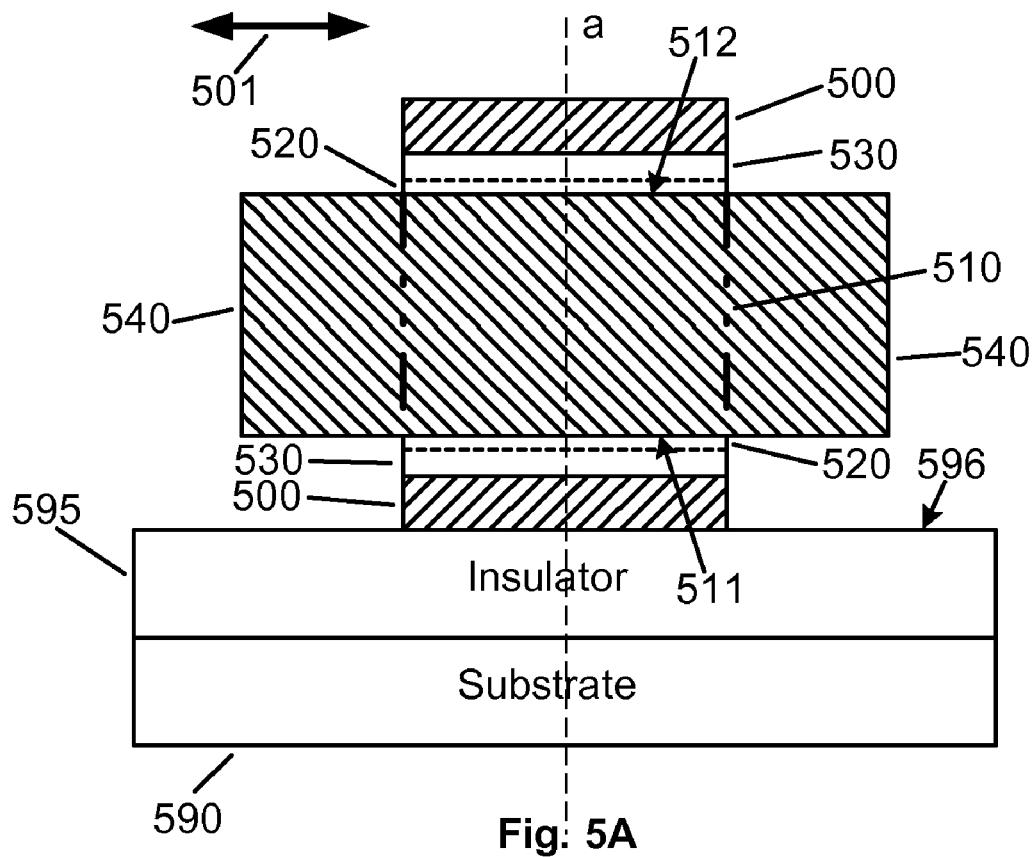
FIG. 5 Shows schematically embodiments of a strained Si based monocrystalline MOSFET on insulator with multifaceted gate, with current flow in parallel with the plane of the supporting platform.
Figure 5B:
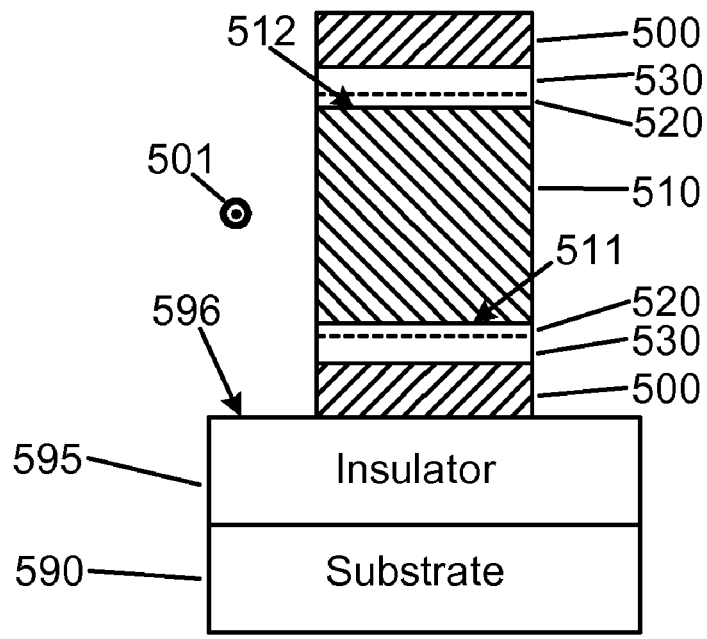

The gate insulator comprises an epitaxial $SiO_2$ layer 520 which is grown onto the strained body, interfacing the channel region and it serves to provide the highest quality interface between the gate insulator and the strained Si based monocrystalline strip. The epitaxial $SiO_2$ layer is typically less than 2 nm thick, and normally it is covered by an additional insulating layer 530, which in the most part is non-epitaxial or amorphous $SiO_2$. In the figure, layers 520 and 530 together comprise the gate insulator, however one skilled in the art would recognize, that layer 530 itself may be a composite layered structure, or in some other situations layer 530 can be completely omitted. Looking at FIG. 5A, the region of the strip 510 between the two thick broken lines is the one between the two gates. Those sides of the device which are not under the gate influence, would typically be covered by a passivating insulator, such as $SiO_2$ or even by an air gap, to render them electrically neutral. The figure does not show this passivating insulator, since passivating insulators are well known in the art. Beyond the gate controlled region of the body, the strip is to be made into a source and a drain 540 respectively. Methods for source/drain formation are known in the art. To assure low source/drain resistance the regions 540 are typically implanted and then silicided afterwards. In FIG. 5B the same structure has been rotated by 90° showing in a cross sectional view along the broken centerline "a". The direction of device currents 501 is now perpendicular to the plane of the drawing, and the arrow 501 indicating the direction of device current flows, looking from a head on perspective and is depicted as concentric circles. Of course the device currents are in parallel direction with the surface plane of the supporting platform 596.

Figure 5C:
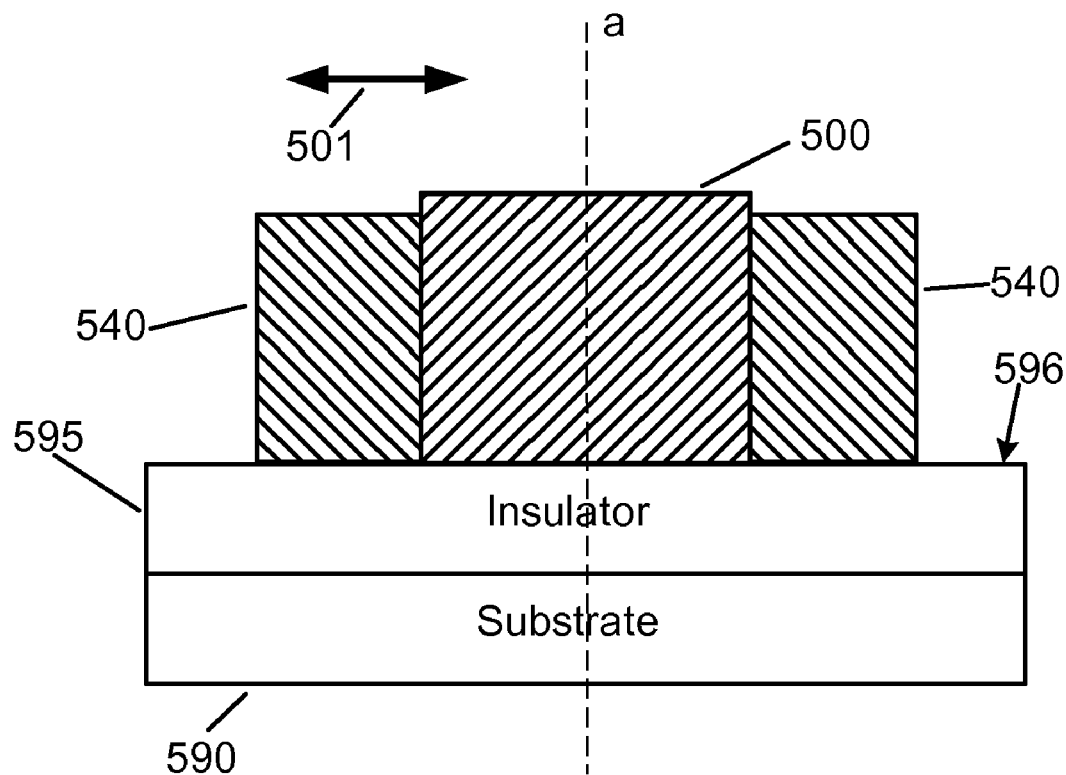
Figure 5D:
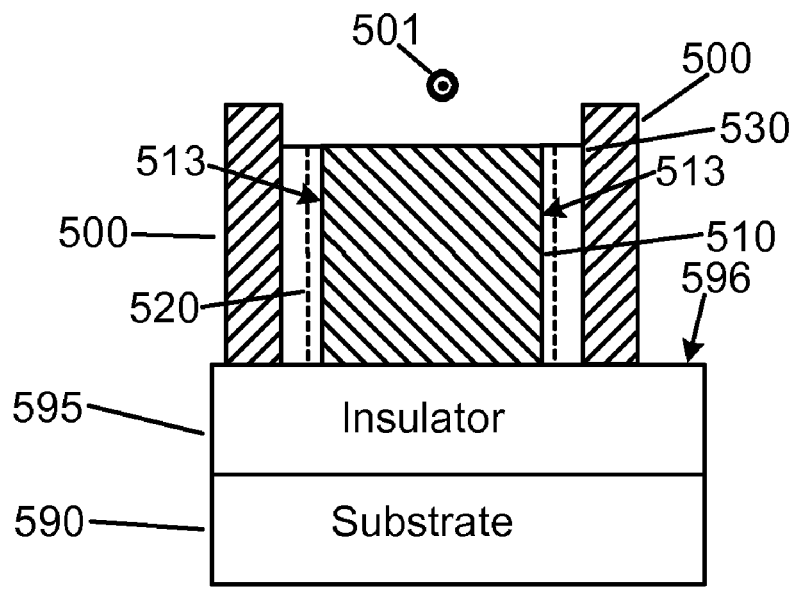

FIG. 5C and FIG. 5D show two views of a strained SiGe MOSFET on insulator where the gate 500 comprises two electrodes on the side facets channel region of the Si based strained strip. Direction of device currents in this device, shown as a thick arrow 501, is in parallel with the surface plane 596 of the supporting platform 595, 590. FIG. 5D shows at least two opposing side facets 513, and the two separate gate electrodes 500 that are engaging the two opposing side facets 513. Direction of device currents are indicated by arrow 501, which are in parallel with the surface plane 596 of the supporting platform 595 and 590. This device is considered to be in a so called "horizontal configuration". The multifaceted device configuration schematically shown in FIGS. 5C and 5D is also sometimes referred in the art as FinFET device configuration.

Figure 10:
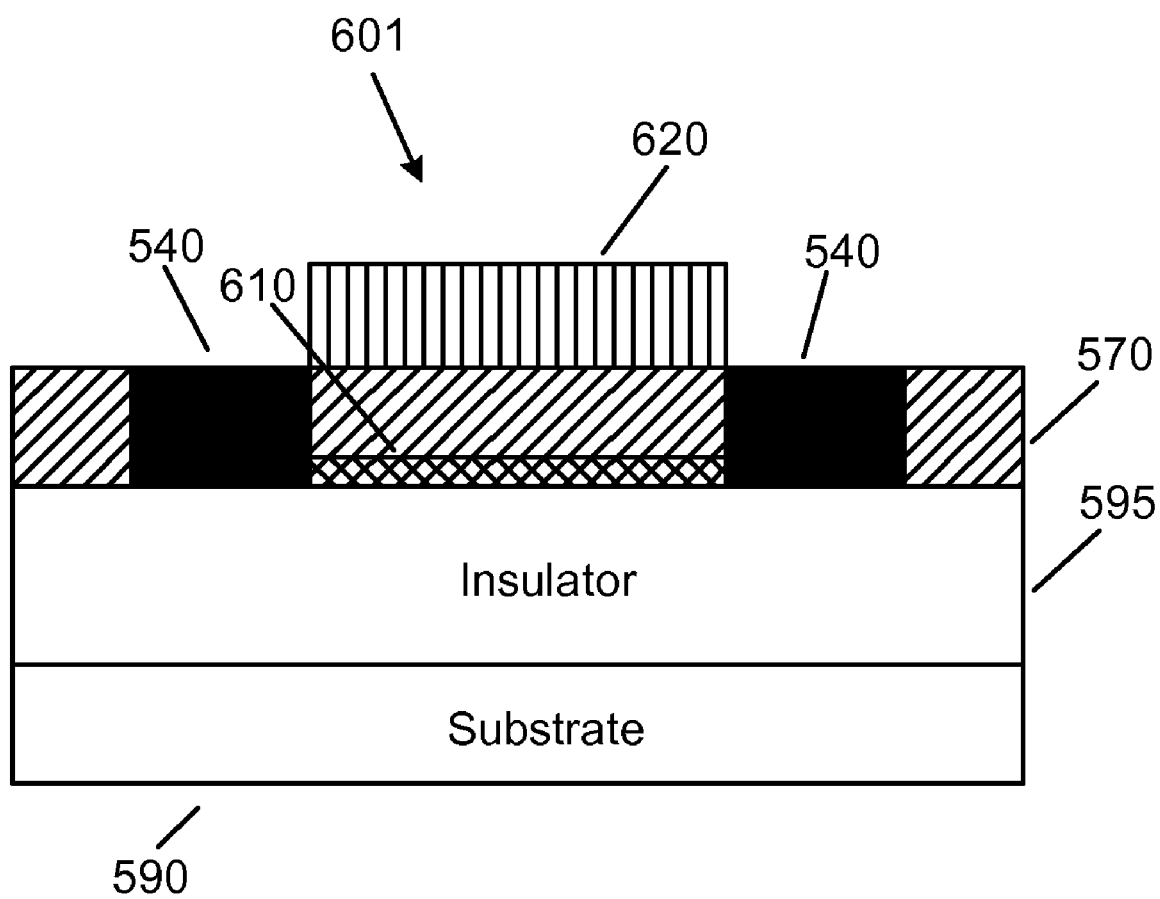
FIG. 10 Shows schematically a MODFET device hosted in a strained Si based layer directly on an insulator.

Details of the fabrication of the strained Si or SiGe strip 510, or in general of a strained Si based material layer such as 570 in FIG. 10, and the way the strip is engaged by bonding means to the supporting platform can be found in the earlier incorporated references: application filed by J. Chu et al on Feb. 11, 2002, Ser. No. 10/073,562, (Now U.S. Pat. No. 6,649,492), and application filed by J. Chu on Mar. 15, 2003, Ser. No. 10/389,145, (Now U.S. Pat. No. 6,963,078). Briefly, the strained Si, SiGe, Si:C, SiGe:C, or Ge layer is grown over a first substrate and a support structure, and then transferred to the supporting platform. The supporting platform is a second substrate 590, the insulator 595, and in some embodiments that part of a the gate 500 which rests on insulator 595. The support structure is removed from the strained Si or SiGe layer by use of selective etching. A thin, pure Si, or pure Ge, layer abutting the strained Si or SiGe layer plays a central role in stopping the etching once the support structure is consumed by the etchent. An epitaxial oxide layer on top of the strained Si, or SiGe, layer, grown before the layer transfer, can promote adhesion to the new supporting platform, and also helps in preserving the strain state of the strained Si, or SiGe, layer. This epitaxial oxide layer will in some embodiments also turned into a part of the gate insulator 520. An additional insulator on top of the epitaxial oxide layer can also be applied, which then will be turned into that portion of layer 530 which faces the supporting platform. In some embodiments of the multifaceted devices, the receiving substrate of the layer transfer, the second substrate, the one which is part of the supporting platform, is prepared with a polysilicon, or a metal, typically silicide, or a combination of the two, on its top, and this polysilicon/metal layer will become part of the multifaceted gate. For the embodiment of FIGS. 5A and 5B this polysilicon/metallic layer is to become the bottom gate electrode of the gate 500. There can be embodiments where the bonding means for strained Si, or SiGe, strip, or layer, to the supporting platform does not involve an epitaxial oxide, or polycrystalline Si, or silicide, and it is simply a bonded interface formed during the a layer transfer step between the insulator, typically $SiO_2$, and the strained Si base material strip, or layer.

Once the layer transfer and the removal of the support structure by etching has been done, and one has the strained Si based material, layer either on the supporting platform or directly on the insulator layer, the fabrication of the strained body strips with its desired multifaceted gate configuration can readily be achieved based upon procedures which are well known in the art of silicon CMOS device fabrication and integration. In contrast, while various combinations of masking, patterning, etching by wet etch, etching by reactive ion etching (RIE), or many similar steps that are used to create the final device structures are well known in the art, novel steps, like the deposition of Si:C, or SiGe:C, for diffusion barriers as part of the gate preparation are part of this invention.

Figure 6A:
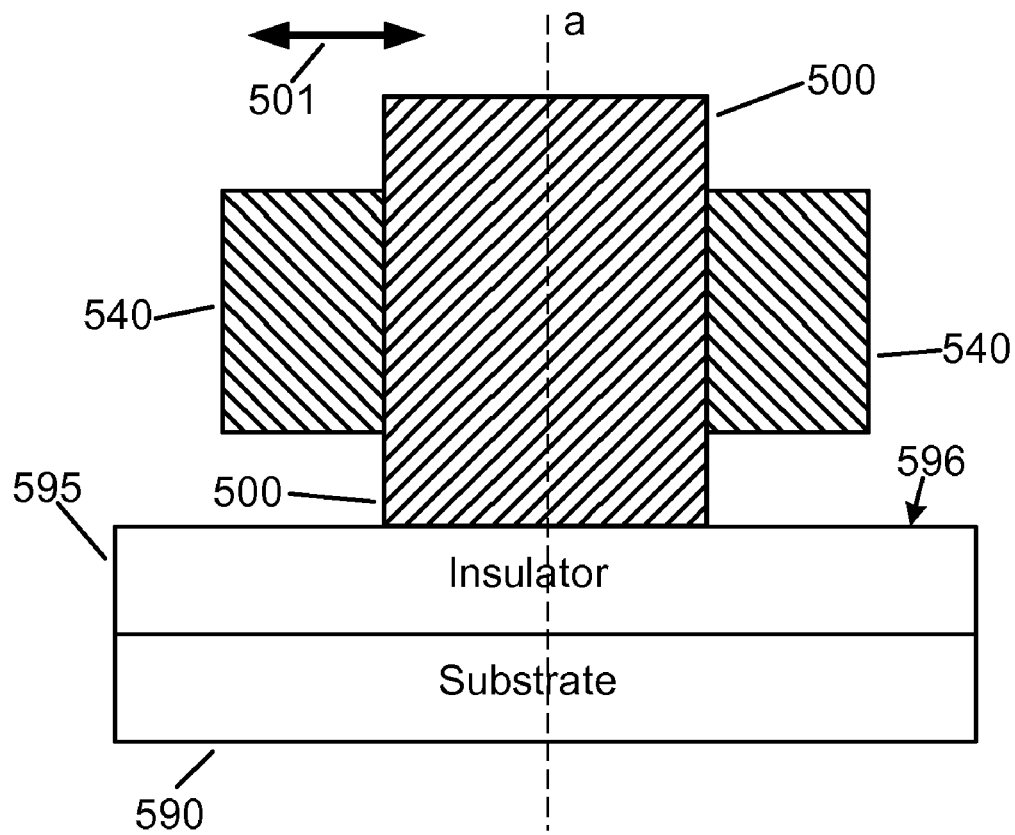
FIG. 6 Shows schematically, in a side view and in a cross sectional view, another embodiment of a strained Si based monocrystalline MOSFET on insulator with multifaceted gate, with current flow in parallel with the plane of the supporting platform.
Figure 6B:
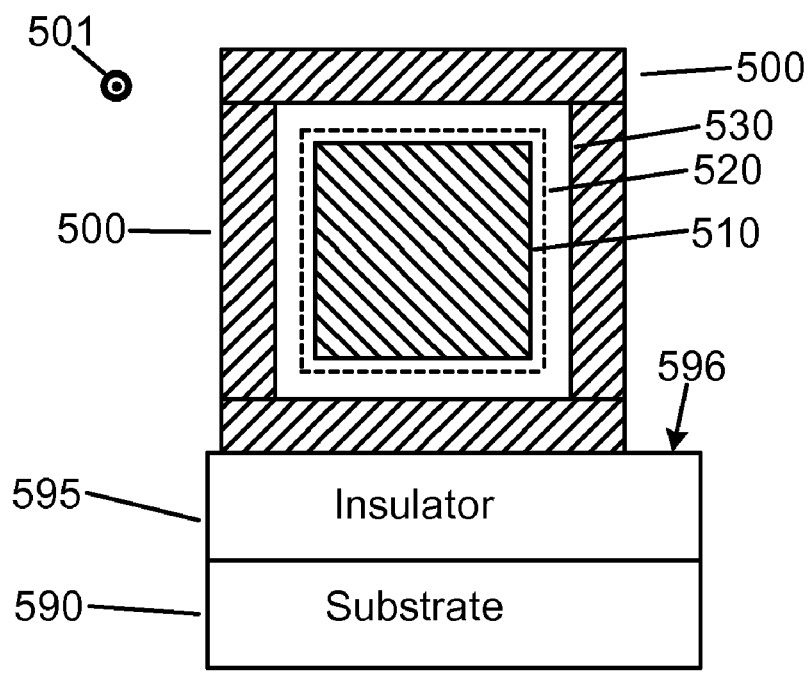

FIG. 6 shows schematically, in a side view and in a cross sectional view, another embodiment of a strained Si based monocrystalline MOSFET on insulator, with a multifaceted gate, with current flow in parallel with the plane of the supporting platform. FIG. 6A shows the side view of the device, and FIG. 6B is a cross sectional view along the broken centerline "a" of FIG. 6A. The embodiment depicted in FIG. 6 differs from that in FIG. 5 only in that the gate now surrounds the strained Si based body completely. It forms a sort of belt around the body. Accordingly, in the side view of FIG. 6A the body 510 is not visible. From the side, only the gate 500 and the source/drain regions 540 are visible. Direction of device currents are indicated by arrow 501, which are in parallel with the surface plane 596 of the supporting platform 595 and 590. All aspects, and fabrication considerations are the same as described relating to the embodiment shown in FIG. 5. The device of FIG. 6 is also in a "horizontal configuration".

Figure 7A:
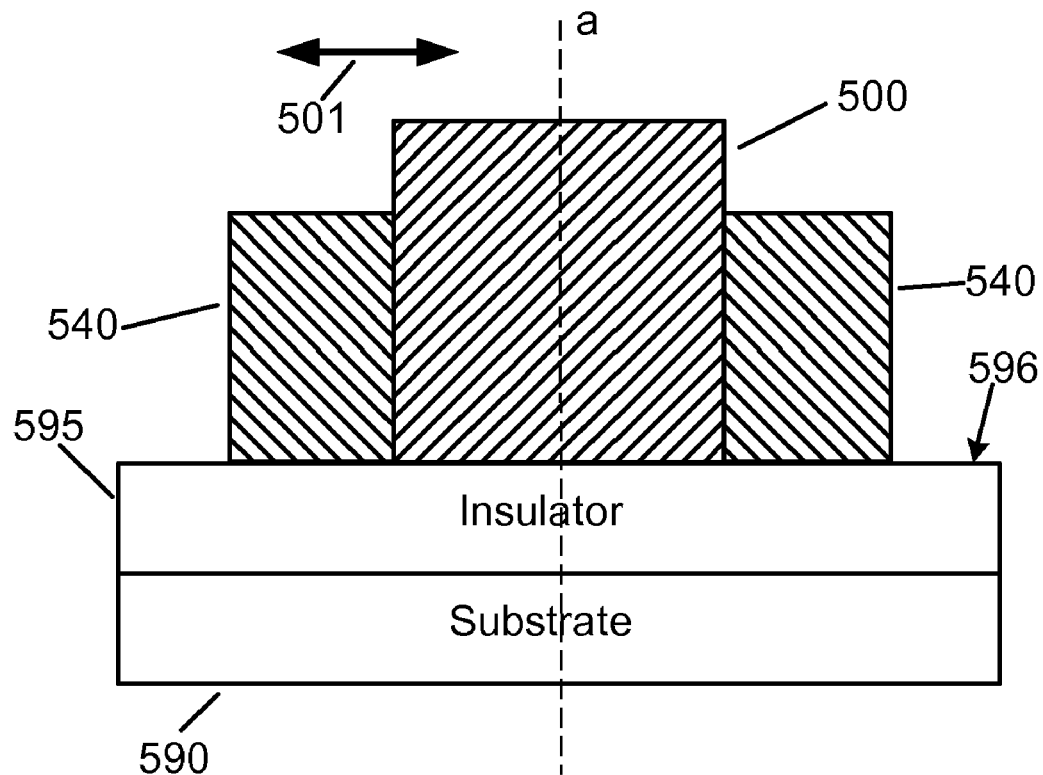
FIG. 7 Shows schematically, in a side view and in a cross sectional view, a further embodiment of a strained Si based monocrystalline MOSFET on insulator with multifaceted gate, with current flow in parallel with the plane of the supporting platform.
Figure 7B:
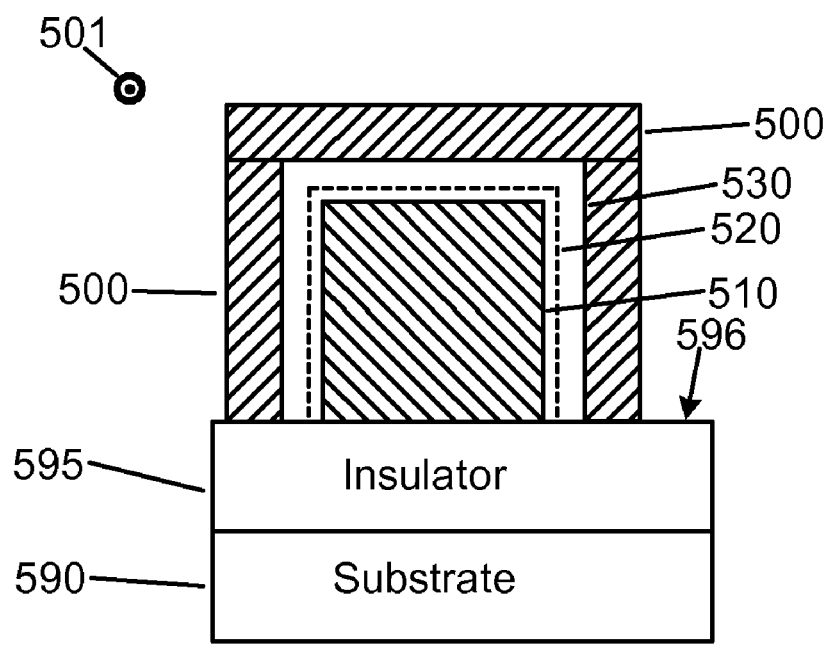

FIG. 7 shows schematically, in a side view and in a cross sectional view, a further embodiment of strained Si based monocrystalline MOSFET on insulator, with a multifaceted gate, and with current flow in parallel with the plane of the supporting platform. FIG. 7A shows the side view of the device, and FIG. 7B is a cross sectional view along the broken centerline "a" of FIG. 7A. The embodiment depicted in FIG. 7 differs from that in FIG. 6 in that here the gate engages all of the facets of the strip with the exception of one facet: that facet, which bonds to the supporting platform. In this embodiment the supporting platform does not include a polysilicon or metallic layer. The supporting platform in FIG. 7 includes only the substrate 590 and insulator layer 595. FIG. 7 does not show a thin epitaxial oxide on the bottom facet of the body 510, which is the bonding facet the supporting platform. In this embodiment the strained Si, Si:C, SiGe, SiGe:C, almost pure Ge, or almost pure Ge:C strip may, or may not, include such an epitaxial oxide. Such an oxide is desirable to promote adhesion to the new supporting platform, and can also help in preserving the strain state in the strained Si or SiGe layer. However, since in this embodiment there is no gate electrode on the bottom facet, a gate insulator and hence epitaxial oxide, are not a necessity. Direction of device currents are indicated by arrow 501, which are in parallel with the surface plane 596 of the supporting platform 595 and 590. All aspects, and fabrication considerations are the same as described relating to the embodiment shown in FIG. 5. The device of FIG. 7 is also in a "horizontal configuration".

Figure 8:
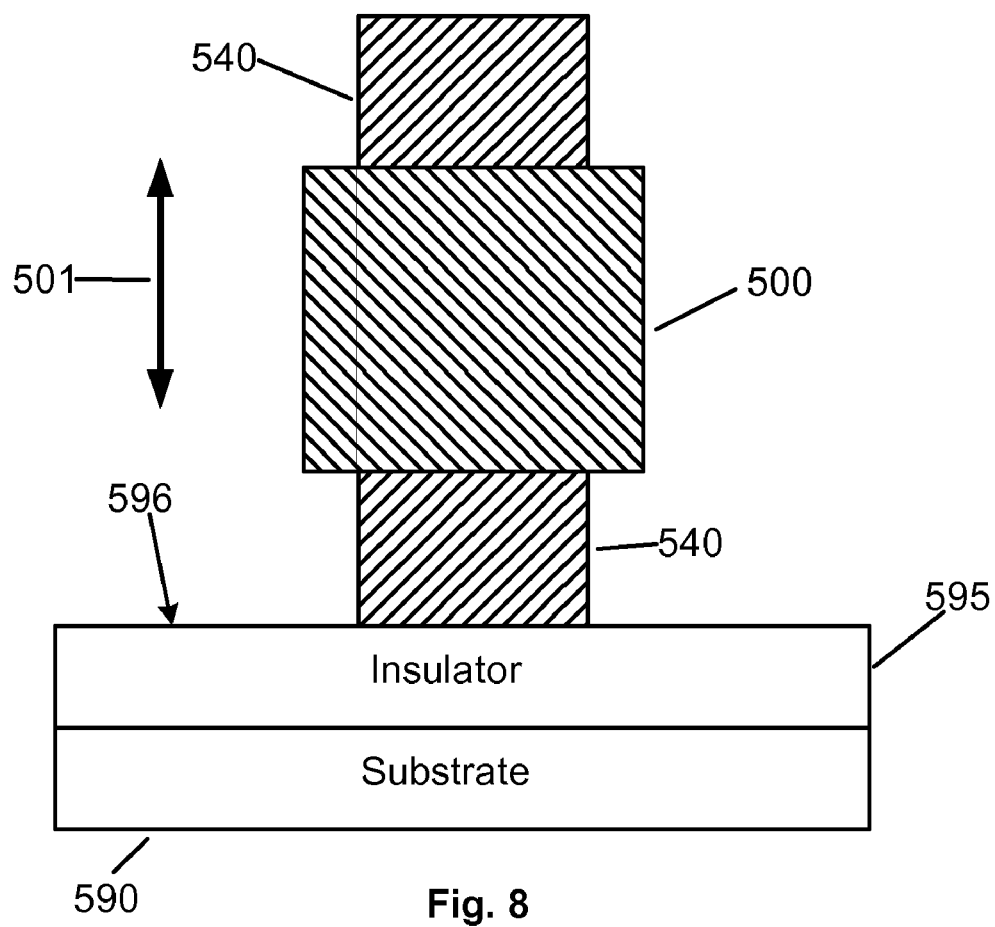
FIG. 8 Shows schematically an embodiment of a strained Si based monocrystalline MOSFET on insulator with multifaceted gate, with current flow in perpendicular to the plane of the supporting platform.

FIG. 8 shows schematically, an embodiment of a strained Si based monocrystalline MOSFET on insulator with multifaceted gate, with current flow in perpendicular to the plane of the supporting platform. This embodiment has a gate 500 completely surrounding the multifaceted channel region (invisible due the gate.) Direction of device currents in this device, shown as a thick arrow 501, is in perpendicular direction to the surface plane 596 of the supporting platform 595, 590. This indicates that the device is in a so called "vertical configuration". The embodiment of this strained SiGe MOSFET on insulator with multifaceted gate of FIG. 8, apart of its orientation, in other aspects and its fabrication it is practically identical with the embodiment depicted for FIG. 6.

Figure 9:
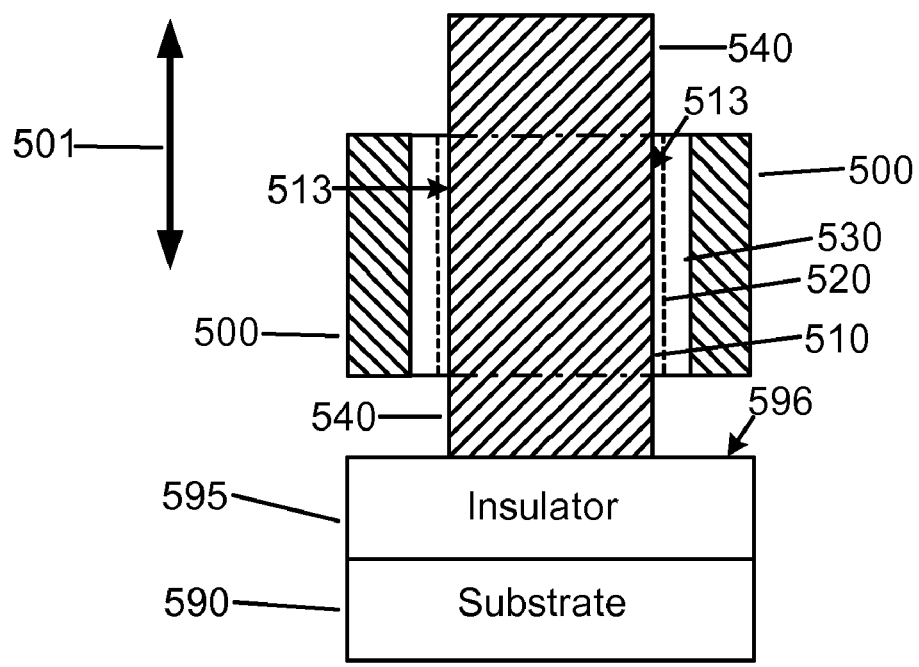
FIG. 9 Shows schematically an alternate embodiment of a strained Si based monocrystalline MOSFET on insulator with multifaceted gate, with current flow in perpendicular to the plane of the supporting platform.

FIG. 9 shows schematically, an alternate embodiment of a strained Si based monocrystalline MOSFET on insulator with multifaceted gate, with current flow in perpendicular to the plane of the supporting platform. The device is double gated, where the gate 500 has two electrodes on two side facets 513 of the multifaceted strained body 510, overlaying the channel regions and interfacing with the gate insulator 520 and 530. Direction of device currents in this device, shown as a thick arrow 501, is in perpendicular direction to the surface plane 596 of the supporting platform 595, 590. This indicates that the device is in a so called "vertical configuration". The embodiment of this strained SiGe MOSFET on insulator with multifaceted gate of FIG. 9, apart of its orientation, in other aspects and its fabrication it is practically identical with the embodiment depicted on FIG. 5C and FIG. 5D. The multifaceted device configuration schematically shown in FIG. 9 can be referred to as a "vertical FinFET" device configuration.

To increase current carrying capacity, for the multifaceted gate structures in general, a multiple-fingered gate configuration can be employed.

For all of these embodiments, as shown in FIGS. 5, 6, 7, 8, and 9 a sub-embodiment in the source drain formation is possible. There are indications that when device channels are truly short, below approximately 50 nm, there maybe an advantage in using a Schottky-barrier contact for the source to channel junction. A process for fabricating CMOS devices with self-aligned Schottky source and drain has been described in a paper entitled: "New Complimentary Metal-Oxide Semiconductor Technology with Self-Aligned Schottky Source/Drain and Low-Resistance T Gates" by S. A. Rishton, et al, J. Vac. Sci. Tech. B 15 (6), 1997, pp. 2795-2798 and is incorporated herein by reference. Accordingly, in all these multifaceted devices, or planar devices as shown on FIG. 2, the source, or source/drain silicidation process can be allowed to proceed until the silicide meets the channel region, whereby it has indeed consumed all of the source/drain junctions. In the process the drain junction might, or might not, turn into a Schottky-barrier contact, but either way is acceptable, since the drain junction resistance is not as important for device performance as the source junction resistance is. Similarly, a selective or a sequential two-step source/drain silicidation process could be employed to create the desired Schottky-barrier contact only for the source region while keeping the normal (low resistance) silicidation process for the drain region the same.

FIG. 10 shows schematically a MODFET device 601 hosted in a strained Si based layer directly on an insulator. FIG. 10 does not go into detail of the MODFET device 601, since such a device is well known in the art. Fabrication of MODFETs in the specific material environment of the Si based strained materials is given for instance in the already incorporated references of U.S. Pat. No. 5,534,713 to K. Ismail and F. Stern, titled "Complementary metal-oxide semiconductor transistor logic using strained SI/SIGE heterostructure layers", and application filed by J. Chu on Mar. 15, 2003, Ser. No. 10/389,145, (Now U.S. Pat. No. 6,963, 078).

The MODFET device 601, independently whether it is an N-MODFET, or P-MODFET, is hosted in the Si based strained layer 570. It is important that the Si based strained layer 570 is directly on the insulator layer 595 without any intervening conducting, or semiconducting buffer layer. Such an arrangement allows for unprecedently low device capacitances resulting in superior high speed device performances. The layer 570 depending of the need of the device can be either tensilely or compressively strained. The critical part of the device, such as the channel 610, is hosted in strained layer 570. This strained Si based layer, typically Si, SiGe, or SiGe: C, or possibly close to pure Ge or Ge:C is directly on an insulator 595. The insulator layer 595, typically $SiO_2$, is engaging the strained Si based monocrystalline layer by bonding means. These means are the same as given in relation to the multifaceted gate devices on insulator, described on FIGS. 5 to 9. The insulator layer 595 is on top a substrate 590, typically a Si wafer. In this embodiment layers 595 and 590 together form the supporting platform. Other usual parts of the MODFET device 601, such as source and drain 540 and auxiliary layers 620 are fabricated by means known in the semiconducting manufacturing arts.

Figure 11:
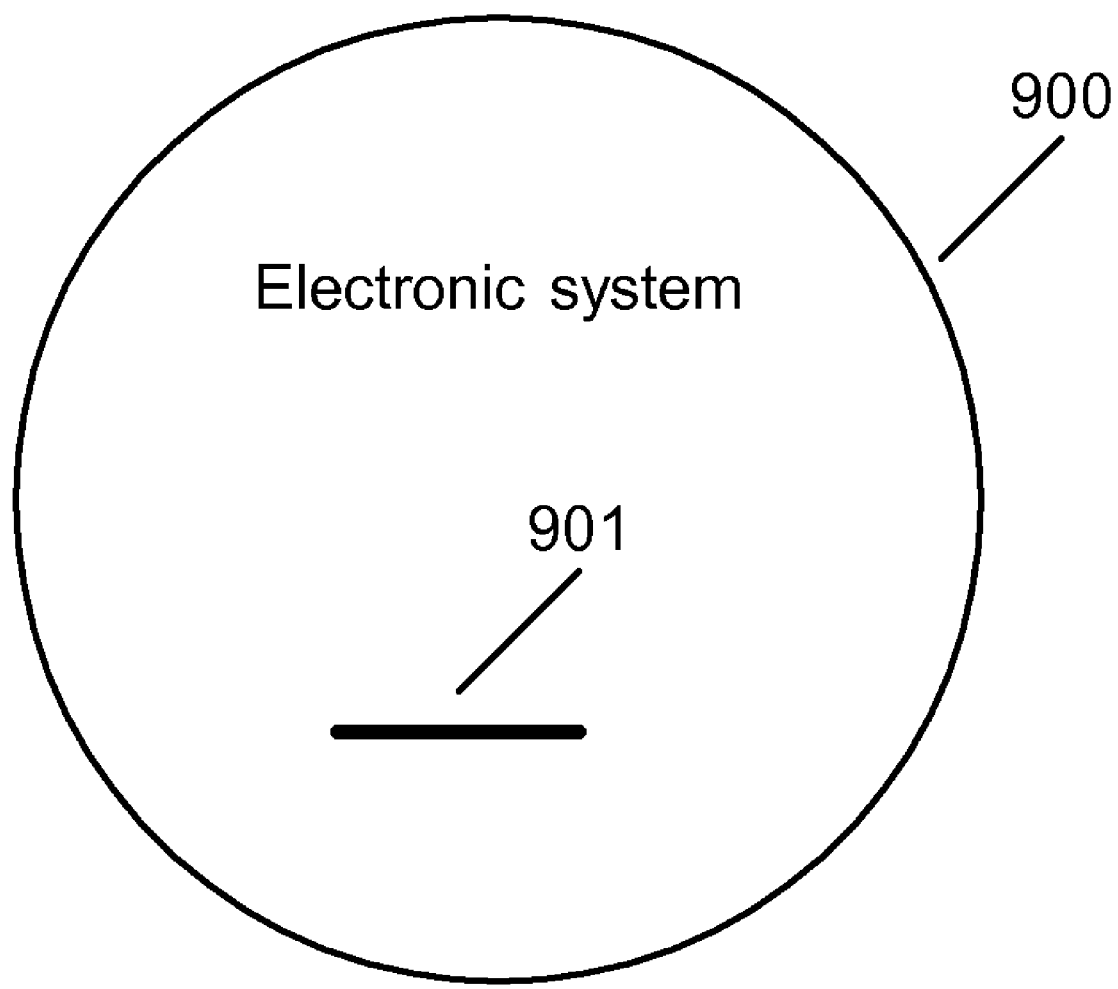
FIG. 11 Shows schematically an electronic system comprising of strained Si based monocrystalline strip multifaceted gate MOSFET on insulator devices.

FIG. 11 shows schematically an electronic system comprising of multifaceted gate strained Si based monocrystalline strip MOSFET on insulator devices. The electronic system 900 can be any processor which can benefit from the high performance afforded by the strained SiGe MOSFET on insulator with multifaceted gate devices. These devices form part of the electronic system in their multitude on one or more chips 901. Embodiments of electronic systems manufactured with the strained SiGe MOSFET on insulator with multifaceted gate devices are digital processors, typically found in the central processing complex of computers; mixed digital/analog processors, which benefit significantly from the high mobility of the carriers in the strained SiGe; and in general any communication processor, such as modules connecting memories to processors, routers, radar systems, high performance video-telephony, game modules, and others.

Many modifications and variations of the present invention are possible in light of the above teachings, and could be apparent for those skilled in the art. The scope of the invention is defined by the appended claims.

I claim:

1. A method for fabricating a SiGe on insulator MOSFET device, comprising:
    using a strained crystalline SiGe on insulator layer for hosting a channel region of said SiGe on insulator MOSFET device;
    depositing a first layer onto a gate insulator layer for said SiGe on insulator MOSFET device, wherein said first layer is Si:C or SiGe:C; and
    employing selective epitaxy for raising a source region of said SiGe on insulator MOSFET device.

2. The method of claim 1, further comprising:
    employing selective epitaxy for raising a drain region of said SiGe on insulator MOSFET device.

3. The method of claim 1, further comprising:
    depositing a second layer on top of said first layer, wherein said second layer is comprising polycrystalline Si, and wherein said second layer doped with impurities to provide a selected workfunction with respect to said channel region;
    forming a gate-stack for said SiGe on insulator MOSFET device, wherein said gate-stack comprises said first layer and said second layer; and
    carrying out a self-aligned silicidation.

4. The method of claim 1, wherein said selective epitaxy is performed by a UHV-CVD technique.

* * * * *